United States Patent [19]

Calviello et al.

[11] Patent Number: 5,159,413
[45] Date of Patent: Oct. 27, 1992

[54] MONOLITHIC INTEGRATED CIRCUIT HAVING COMPOUND SEMICONDUCTOR LAYER EPITAXIALLY GROWN ON CERAMIC SUBSTRATE

[75] Inventors: Joseph A. Calviello, Kings Park; Grayce A. Hickman, Hicksville, both of N.Y.

[73] Assignee: Eaton Corporation, Cleveland, Ohio

[21] Appl. No.: 625,483

[22] Filed: Dec. 11, 1990

Related U.S. Application Data

[62] Division of Ser. No. 511,589, Apr. 20, 1990.

[51] Int. Cl.$^5$ .................. H01L 27/02; H01L 29/14
[52] U.S. Cl. ........................... 505/1; 357/4; 357/16; 357/61; 357/80
[58] Field of Search ............. 357/4, 16, 61, 80; 505/1

[56] References Cited

U.S. PATENT DOCUMENTS

| | | |
|---|---|---|
| 3,199,003 | 8/1965 | Turner . |
| 3,618,203 | 11/1971 | Pryor ........................ 357/74 |
| 3,721,583 | 3/1973 | Blakeslee .................. 357/4 |
| 3,735,211 | 5/1973 | Kapnias . |
| 3,744,120 | 7/1973 | Burgess et al. . |
| 3,766,634 | 10/1973 | Babcock et al. . |
| 3,854,892 | 12/1974 | Burgess et al. . |
| 3,911,553 | 10/1975 | Burgess et al. . |
| 3,993,411 | 11/1976 | Babcock et al. . |
| 3,994,430 | 11/1976 | Cusano et al. . |
| 4,129,243 | 12/1978 | Cusano et al. . |
| 4,368,098 | 1/1983 | Manasevit ............... 156/606 |
| 4,473,938 | 10/1984 | Kobayashi et al. . |
| 4,632,712 | 12/1986 | Fan et al. ................ 357/16 |
| 4,833,101 | 5/1989 | Fujii . |
| 4,837,536 | 6/1989 | Honjo ...................... 357/51 |
| 4,855,249 | 8/1989 | Akasaki ................... 357/16 |
| 4,908,074 | 3/1990 | Hosoi et al. ............. 357/16 |
| 4,927,471 | 5/1990 | Okuda ..................... 357/16 |
| 4,948,752 | 8/1990 | Geissberger et al. . |
| 4,963,508 | 10/1990 | Umeno ..................... 357/16 |

FOREIGN PATENT DOCUMENTS

| | | | |
|---|---|---|---|
| 0364068 | 4/1990 | European Pat. Off. .......... 357/16 |
| 55-3834 | 1/1980 | Japan .................. 357/17 |
| 0035412 | 4/1981 | Japan . |
| 0107721 | 5/1986 | Japan . |
| 0053913 | 3/1988 | Japan . |
| 63-228714 | 9/1988 | Japan .................. 357/16 |
| 0248121 | 10/1988 | Japan . |
| 0049215 | 2/1989 | Japan . |
| 1-256113 | 10/1989 | Japan .................. 357/16 |

OTHER PUBLICATIONS

Ishiwara et al. *Mat Res. Symp.* Proced. vol. 67 1986 pp. 105–114.

Koren et al. Appl. Phys Lett (54)(11) Mar. 13, 1989 pp. 1054–1056 "Eppitaxial . . . Albation".

"A High Performance 0.12 μm T-Shape Gate Ga$_{0.5}$In$_{0.5}$As/Al$_{0.5}$In$_{0.5}$As MOSFET Grown By MBE Lattices Mismatched on A GaAs Substrate", Y. K. Chen et al, IEDM 431–434 (Dec. 1986).

"0.1 -μm Gate Al$_{0.5}$In$_{0.5}$As/GA$_{0.5}$In$_{0.5}$As MODFET Fabricated On GaAs Substrates", G. W. Wang et al, IEEE Trans Electron Devices 35(7) 818–823 (1988).

"New Ceramics Fill Performance Gaps", Ronald Pound, Electronic Packaging & Production, pp. 30–33, Sep. 1987.

(List continued on next page.)

Primary Examiner—Jerome Jackson, Jr.
Attorney, Agent, or Firm—Andrus, Sceales, Starke & Sawall

[57] ABSTRACT

A semiconductor device and processing technique is provided for monolithic integration of a single crystal compound element semiconductor on a ceramic substrate. A high resistivity semi-insulating buffer layer is epitaxially grown on the ceramic substrate and has an elastically transitional lattice constant matching at its lower surface the lattice constant of the ceramic substrate, and matching at its upper surface the lattice constant of the semiconductor layer.

11 Claims, 16 Drawing Sheets

OTHER PUBLICATIONS

"Heteroepitaxial Growth and Characterization of GaAs on Silicon-on-Sapphire and Sapphire Substrates", T. P. Humphreys et al, Appl. Phys. Lett. 54(17), Apr. 24, 1989, pp. 1687–1689.

"Heteroepitaxial Growth of GaAs on Sapphire Substrates By A Three-Step Method Using Low Pressure MOCVD" Sugimura et al, J. Crys. Growth, vol. 77, 1986, pp. 524–529.

"High Quality GaAs on Si and its Application to a Solar Cell", Ohmachi et al, Mat. Res. Soc. Symp. Proc., vol. 144, 1989, pp. 297–302.

"Epitaxy of GaAs on Si: MBE and OMCVD", Lee et al, Mat. Res. Soc. Symp. Proc., vol. 91, 1987, pp. 33–45.

"Lattice-Matched Epitaxial Growth of Semiconductor Films Onto Insulator (Mixed Fluoride)/Si Structures", Hiroshi Ishiwara et al, Japanese Jour. of Applied Physics, vol. 22 (1983), Supplement 22-1, pp. 201–204.

MONOLITHIC INTEGRATED CIRCUIT HAVING COMPOUND SEMICONDUCTOR LAYER EPITAXIALLY GROWN ON CERAMIC SUBSTRATE

This is a division of application Ser. No. 07/511,589, filed Apr. 20, 1990.

BACKGROUND AND SUMMARY

The invention relates to monolithic integrated circuits fabricated on low loss, high resistivity ceramic substrates.

The invention arose during continuing development efforts directed toward manufacturing advanced and cost effective microwave, millimeter and electro-optic monolithic integrated circuits (MMICs) capable of high temperature operation. A new approach adapts a low loss, high resistivity ceramic substrate onto which is grown high resistivity semi-insulating buffer layer to transitionally achieve lattice match to a compound semiconductor's lattice, and enable growth of single crystalline epitaxial layers to fabricate the MMICs.

The ability to grow active layer single crystal compound semiconductors, such as GaAs, GaAlAs, InGaAs, Si and InP, and to develop a transitional buffer layer to achieve lattice match enables a totally new approach to the development and methods of fabricating MMICs capable of highest performance and reliability, and for operation in the microwave to optical wavelength region.

In a further embodiment, selected buffer layers enable growth of high temperature superconductors (HTS) on the same ceramic substrate, in addition to the above noted active layer. Active components such as FETs, MESFETs, diodes, HEMTs (high electron mobility transistors) and the like are fabricated in the active layer. Passive components such as low loss passive networks, filters, delay lines, capacitors, resistors, etc. are fabricated in the HTS layer.

In a further embodiment, electro-optical devices are fabricated on the same substrate. The ability to use a ceramic substrate having a low loss tangent and which is optically transmissive, facilitates the fabrication of electro-optical transmitters and receivers.

In a further embodiment, the epitaxial growth on the ceramic substrate eliminates a semi-insulating layer otherwise discretely bonded on the substrate and subject to fracture problems due to mechanical stresses caused by mismatch of thermal expansion coefficients. The invention improves reliability and minimizes the noted fracture problems by eliminating the discrete bonding of the semi-insulating layer to the ceramic substrate and by eliminating the semi-insulating layer, which also improves thermal conductivity of an MMIC by eliminating the poor thermal conductivity semi-insulating layer. The invention also enables hermetic sealing of the MMIC by direct eutectic bonding of a metal cover to the ceramic substrate.

BRIEF DESCRIPTION OF THE DRAWINGS

FIG. 13 is RS spectrum of sample #1 using 4880 A. The peak at 269 cm$^{-1}$ is TO. There is no evidence for LO.
FIG. 14 is RS spectra of GaAs-on-sapphire (bazel plane) sample #1 using the 5145 A line. The sharp peak at 267 cm$^{-1}$ is a plasma line and not TO.
FIG. 15 is experimental PR spectrum (solid line) of GaAs-on-sapphire sample #1 (bazel-plane).
FIG. 16 is RS spectra of GaAs-on-sapphire sample #2 (bazel-plane) using 5145 A.
FIG. 17 is experimental PR spectrum (solid line) of GaAs-on-sapphire sample #2 (bazel-plane).
FIG. 18 is RS spectra of GaAs-on-sapphire sample #3 (bazel-plane) using 5145 A.
FIG. 19 is experimental PR spectrum (solid line) of GaAs-on-sapphire (bazel plane) sample #3. The solid line is a lineshape fit.
FIG. 20 is RS spectrum of sample #4 using 4880 A.
FIG. 21 is RS spectra of GaAs-on-sapphire sample #4 (r-plane) using 5145 A.
FIG. 22 is experimental PR spectrum (solid line) of GaAs-on-sapphire (r-plane) sample #4.

DETAILED DESCRIPTION

Figure 1:
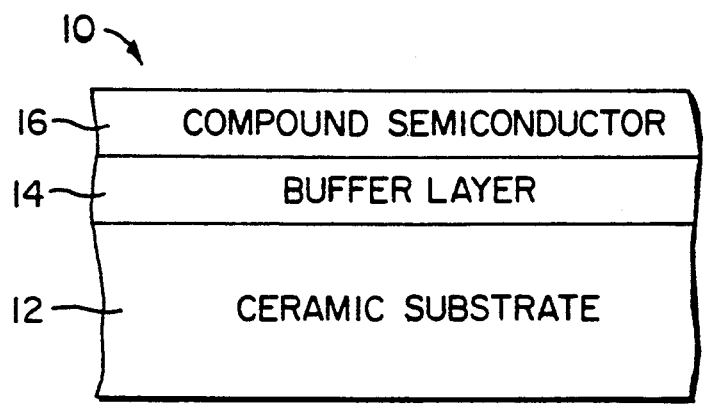
FIG. 1 shows a semiconductor device in accordance with the invention.

FIG. 1 shows a semiconductor device 10 including a ceramic substrate 12, a buffer layer 14 epitaxially grown on substrate 12 and transitionally matching the lattice of a compound element semiconductor layer, and a compound element semiconductor layer 16 epitaxially grown on buffer layer 14. Buffer layer 14 is a semiinsulating layer of high resistivity, eg. greater than about $10^7$ ohm-cm. Buffer layer 14 and compound semiconductor layer 16 are preferably grown by molecular beam epitaxy, to be described. Buffer layer 14 is single crystalline with ceramic substrate 12. Compound semiconductor layer 16 is single crystalline with buffer layer 14. Buffer layer 14 has an elastically transitional lattice constant matching at its lower surface the lattice constant of ceramic substrate 12 within a first given range, and matching at its upper surface the lattice constant of semiconductor layer 16 within a second given range. The first range is 2% to 40%. The second range is 0.5% to 5%. Buffer layer 14 has a lattice constant of 3 to 6, and a thickness of 3 microns to 5 microns. Buffer layer 14 is preferably selected from the group consisting of $Al_2O_3$, ZnS, $TiO_2$, $ThO_2$, $ZrO_2$, BeO, $MgAl_2O_4$, AlN, $LaAlO_3$, $LaGaO_3$, $SrTiO_3$, GaInAs, AlInAs, $CaF_2$, $SrF_2$, $BaF_2$ and InSb, or other oxides or nitrides. Ceramic substrate 12 is preferably selected from the group consisting of sapphire, aluminum nitride, silicon carbide, synthetic diamond, and metal oxides. Compound semiconductor layer 16 is preferably selected from the group consisting of GaAs, GaAlAs, InGaAs, InP, AlInAs. In a further embodiment, an interface layer, selected from the group consisting of an intrinsic layer of silicon and an intrinsic layer of germanium, is between layers 16 and 14.

Single crystal buffer layer 14 on substrate 12 has a mismatch in lattice constant relative to substrate 12 resulting in compressive stress, to be described, such that buffer layer 14 initially has a lattice constant larger than substrate 12 such that lattice mismatch dislocations are turned in a direction parallel to the interface between buffer layer 14 and substrate 12 and such that the dislocations remain confined at the location of the interface. The lattice constant of substrate 12 is about 4 to 5, depending upon the ceramic material chosen. The lattice constant of semiconductor layer 16 is 5.65 for GaAs. Buffer layer 14 provides transitional lattice constant matching between substrate 12 and semiconductor layer 16, for example for $Al_2O_3$, alpha is 5.13 and beta is 5.56. Buffer layer 14 is provided by progressively growing a series of buffer layers of increasing lattice constant, each turning mismatch dislocations toward substrate 12. This technique involves sequentially growing multiple thin buffer layers and transitionally changing the lattice constant of the buffer layers to establish a different lattice constant at the top sequentially grown buffer layer than at the bottom buffer layer. The buffer layers are grown by molecular beam epitaxy at a temperature of about 300° C. to 700° C. During about the first 100 angstroms of growth, the temperature is periodically increased to 900° C. to 1,000° C. to anneal monolayers as they are formed, to minimize discontinuities. The temperature is increased to the 900°-1,000° C. range every 10 to 20 angstroms of growth of the buffer layer. The temperature is ramped up from the 300°-700° C. range to the 900°-1,000° C. range, and then ramped back down to the 300°-700° C. range. The length of the up ramp is 10 to 30 seconds, and the temperature is held in the upper range of 900°-1,000° C. for 1 to 5 seconds, and the length of the down ramp is 10-30 seconds.

Figure 2:
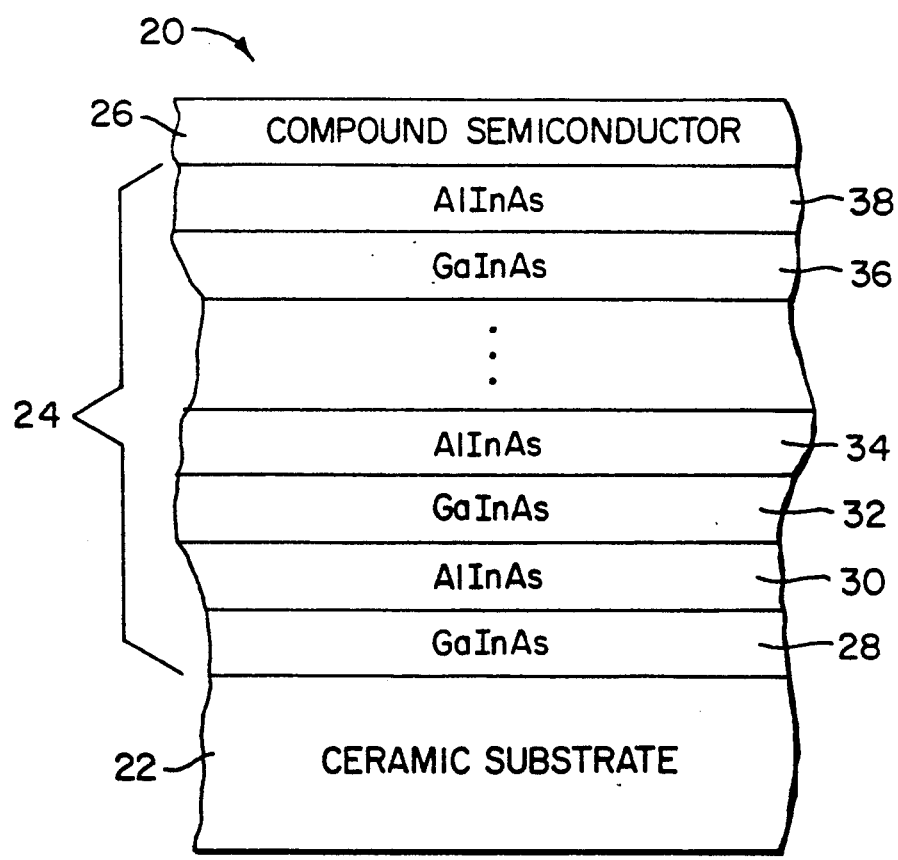
FIG. 2 shows a further embodiment of FIG. 1.

FIG. 2 illustrates another embodiment and semiconductor processing technique for depositing a single crystal compound semiconductor layer on a ceramic substrate. Device 20 in FIG. 2 includes a ceramic substrate 22, a super-lattice-strained structure 24 of GaInAs and AlInAs layers grown on the substrate, and a compound element semiconductor layer 26 epitaxially grown on super-lattice-strained structure 24. First GaInAs layer 28 is epitaxially grown on substrate 22, and then AlInAs layer 30 is epitaxially grown on layer 28, and then GaInAs layer 32 is epitaxially grown on layer 30, and then AlInAs layer 34 is epitaxially grown on layer 32, and so on to a desired number of pairs of GaInAs and AlInAs layers to the uppermost pair of layers 36 and 38. Compound element semiconductor layer 26 is then grown epitaxially on uppermost AlInAs layer 38. In one embodiment, each of the GaInAs and AlInAs layers is grown to a thickness of 10 angstroms to 50 angstroms, and such layers are grown to a total thickness of super-lattice-strained structure 24 of 3 microns to 5 microns. The lattice constants of GaInAs and AlInAs are 5.5 and 5.8, respectively, and provide transitional lattice constant matching between ceramic substrate 22 and compound semiconductor layer 26.

Figure 3:
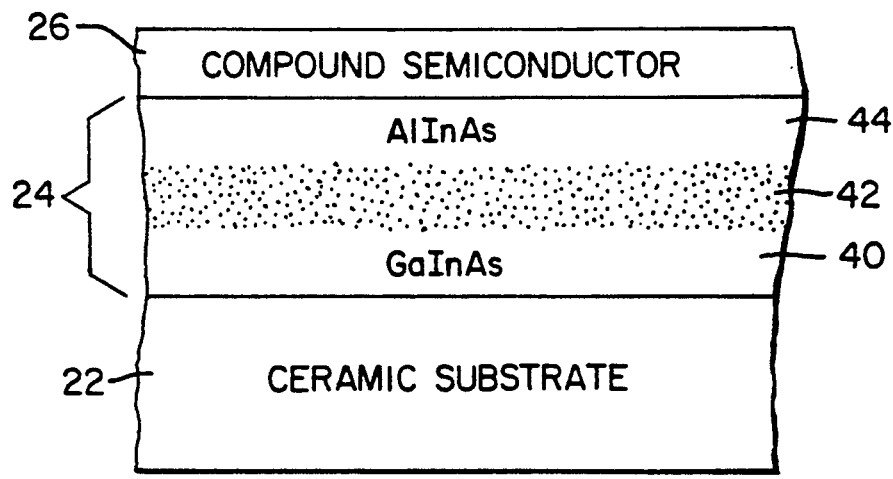
FIG. 3 shows an alternate embodiment of FIG. 2.

In another embodiment, FIG. 3, super-lattice-strained structure 24 has a GaInAs layer 40 grown on ceramic substrate 22. During the growth, the Ga dopant concentration is gradually decreased and the Al dopant concentration is gradually increased to gradually transition GaInAs layer 40 through central zone 42 to an upper zone AlInAs layer 44 for epitaxial growth thereon of compound element semiconductor layer 26.

Figure 4:
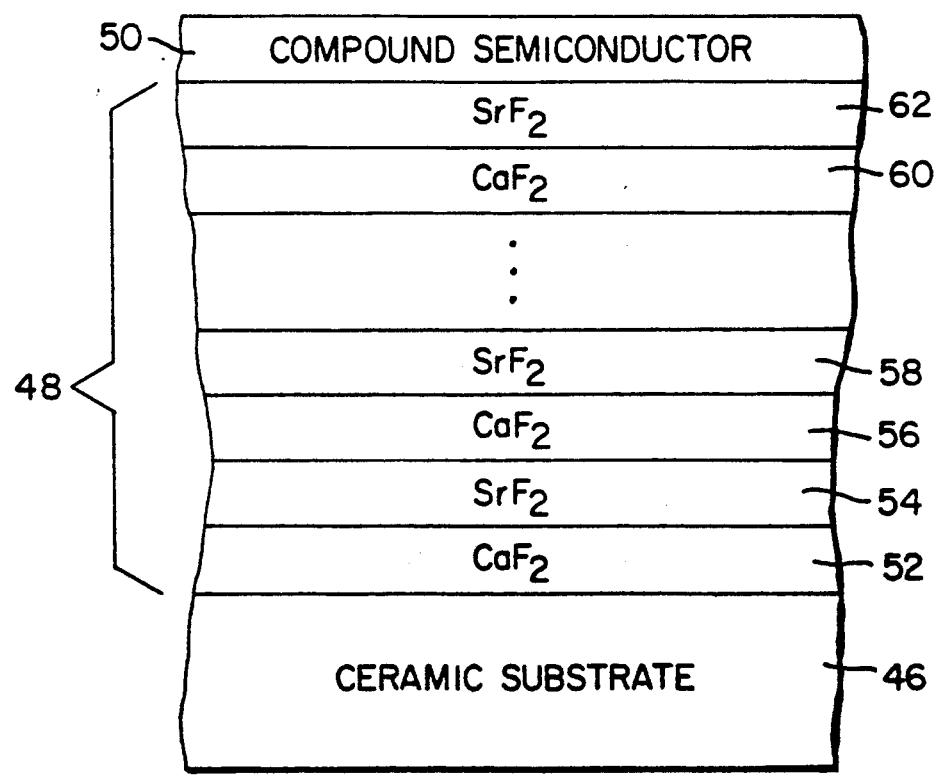
FIG. 4 shows a further embodiment.

FIG. 4 shows an alternate embodiment of FIG. 2, including a ceramic substrate 46, a super-lattice-strained structure 48 of alternating layers of $CaF_2$ and $SrF_2$ epitaxially grown on substrate 46, and a compound element semiconductor layer 50 epitaxially grown on super-lattice-strained structure 48. $CaF_2$ layer 52 is epitaxially grown on substrate 46, and then $SrF_2$ layer 54 is epitaxially grown on layer 52, and then $CaF_2$ layer 56 is epitaxially grown on layer 54, and then $SrF_2$ layer 58 is epitaxially grown on layer 56, and so on to an upper pair of layers 60 and 62. Compound semiconductor layer 50 is epitaxially grown on uppermost $SrF_2$ layer 62. The lattice constants of $CaF_2$ and $SrF_2$ are 5.4 and 5.8, respectively, and provide transitional lattice constant matching between ceramic substrate 46 and compound semiconductor layer 50.

Figure 5:
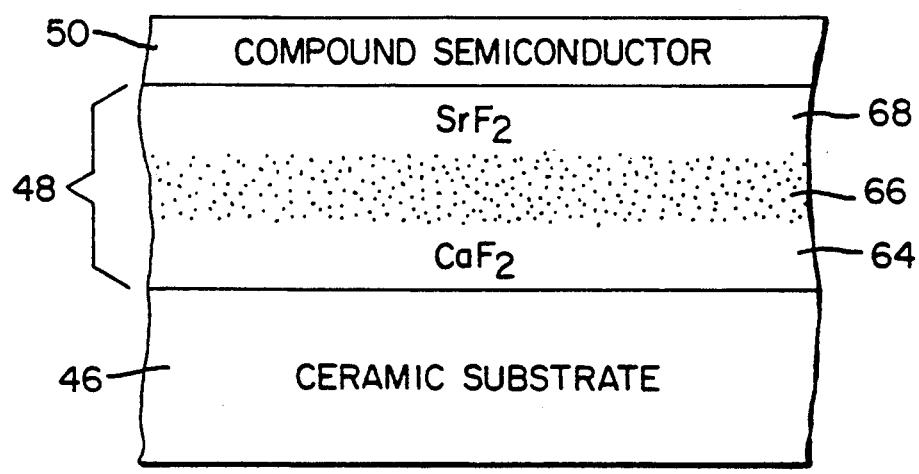
FIG. 5 shows an alternate embodiment of FIG. 4.

In a further embodiment, FIG. 5, super-lattice-strained structure 48 includes $CaF_2$ layer 64 epitaxially grown on substrate 46. During the growth, the Ca dopant concentration is gradually decreased and the Sr dopant concentration is gradually increased to provide a central transition region at 66, and during continued growth, the Ca dopant concentration is further decreased and the Sr dopant concentration is further increased to provide a high Sr dopant concentration layer 68 at an upper zone and gradually transitioning the $CaF_2$ layer 64 to the $SrF_2$ layer 66.

Figure 6:
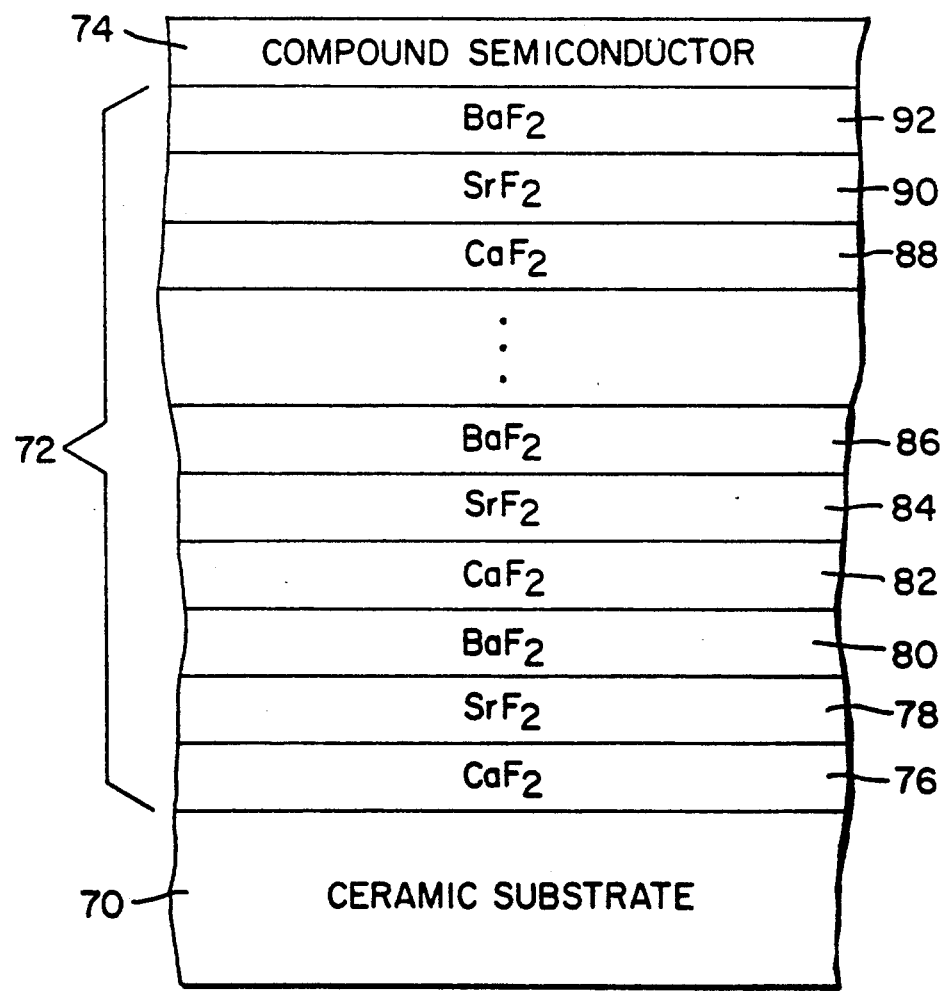
FIG. 6 shows a further embodiment.

FIG. 6 shows a further embodiment including a ceramic substrate 70, a super-lattice-strained structure 72 of sequential layers of $CaF_2$, $SrF_2$ and $BaF_2$ on substrate 70, and a compound element semiconductor layer 74 epitaxially grown on super-lattice-strained structure 72. $CaF_2$ layer 76 is epitaxially grown on ceramic substrate 70, and $SrF_2$ layer 78 is epitaxially grown on layer 76, and $BaF_2$ layer 80 is epitaxially grown on layer 78, and $CaF_2$ layer 82 is grown on layer 80, and $SrF_2$ layer 84 is grown on layer 82, and $BaF_2$ layer 86 is grown on layer 84, and so on to a desired number of sets of $CaF_2$, $SrF_2$, and $BaF_2$ layers to the uppermost set of layers 88, 90, 92. Compound semiconductor layer 74 is epitaxially grown on the uppermost $BaF_2$ layer 92. The lattice constants of $CaF_2$, $SrF_2$, and $BaF_2$ are 5.4, 5.8 and 6.2, respectively, and provide transitional lattice constant matching between ceramic substrate 70 and compound semiconductor layer 74.

Figure 7:
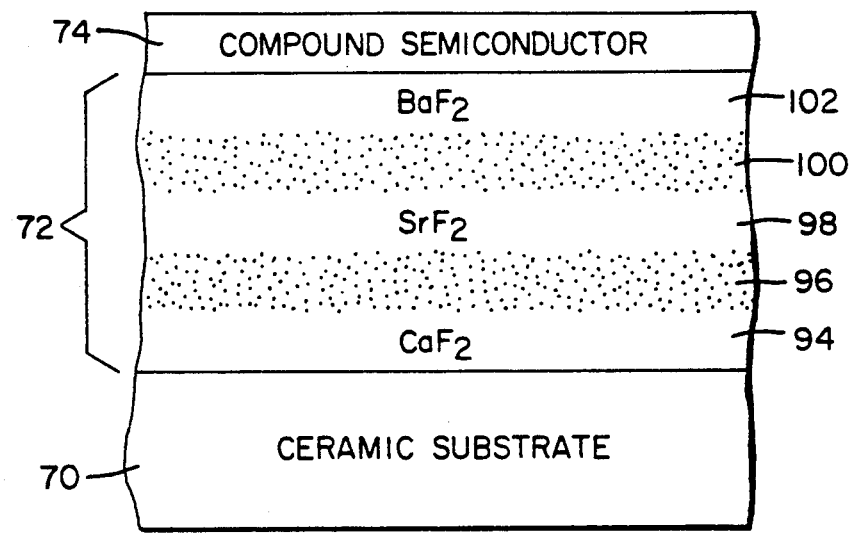
FIG. 7 shows an alternate embodiment of FIG. 6.

In a further embodiment, FIG. 7, super-lattice-strained structure 72 includes a $CaF_2$ layer 94 epitaxially grown on ceramic substrate 70. During such growth, the Ca dopant concentration is gradually decreased and the Sr dopant concentration is gradually increased to gradually transition at region 96 the $CaF_2$ layer to an $SrF_2$ layer 98, and during continued growth gradually decreasing Sr dopant concentration and gradually increasing Ba dopant concentration to gradually transition at zone 100 the $SrF_2$ layer 98 to $BaF_2$ layer 102.

In a prior art group III-V compound element semiconductor monolithic microwave integrated circuit, MMIC, having integrated circuitry formed in a group III-V compound element semiconductor layer grown on a group III-V compound element semi-insulating layer which is discretely bonded on a ceramic substrate and subject to fracture problems due to mechanical stresses caused by mismatch of thermal expansion coefficients, the present invention provides a method and structure for improving reliability and minimizing fracture problems by eliminating the discrete bonding of the semi-insulating layer to the ceramic substrate and by eliminating the semi-insulating layer. Thermal conductivity of the MMIC is also improved by eliminating the poor thermal conductivity semi-insulating layer. A buffer layer is grown on the ceramic substrate and transitionally matches the lattice of the group III-V compound element semiconductor layer. The compound element semiconductor layer is grown on the buffer layer such that heat is transferred from the semiconductor layer and the buffer layer directly to the ceramic substrate, without otherwise having to pass through a poor thermal conductivity semi-insulating layer. This also eliminates the additional thickness of a semi-insulating layer to in turn shorten the thermal conduction path length. This also eliminates the discrete bonding of the semi-insulating layer to the ceramic substrate The compound element semiconductor layer is preferably GaAs, GaAlAs, InGaAs, InP or AlInAs.

Figure 8:
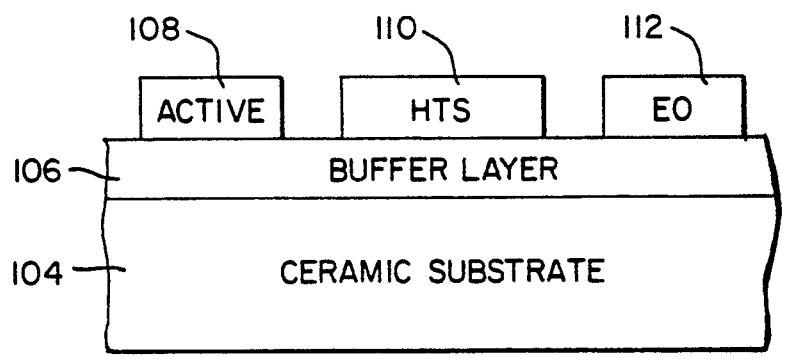
FIG. 8 shows a further embodiment.

In one embodiment, FIG. 8, ceramic substrate 104 has a high resistivity semi-insulating buffer layer 106 with an active semiconductor layer 108, a high temperature superconductor (HTS) layer 110, and an optoelectronic layer 112. Active layer 108 is provided for integration of active components such as FETs, MESFETs, diodes, HEMTs (high electron mobility transistors), etc. HTS layer 110 is provided for integration of passive components such as low loss passive networks, filters, delay lines, capacitors, resistors, etc. Opto-electronic layer 112 is provided for integration of opto-electronic integrated circuitry, such as lasers, photodetectors, etc. In this embodiment, an optically transparent ceramic substrate 104 and buffer layer 106 is provided such that the opto-electronic integrated circuitry in layer 112 receives light from above and/or from below through substrate 104 and buffer layer 106.

Figure 9:
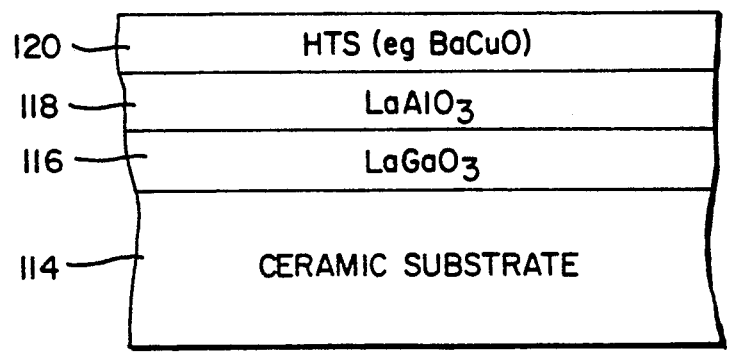
FIGS. 9-11 show a processing technique in accordance with the invention.
Figure 10:
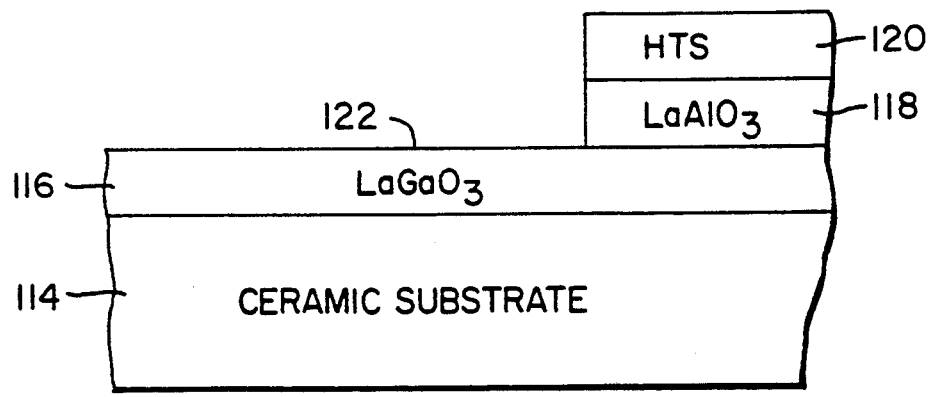
Figure 11:
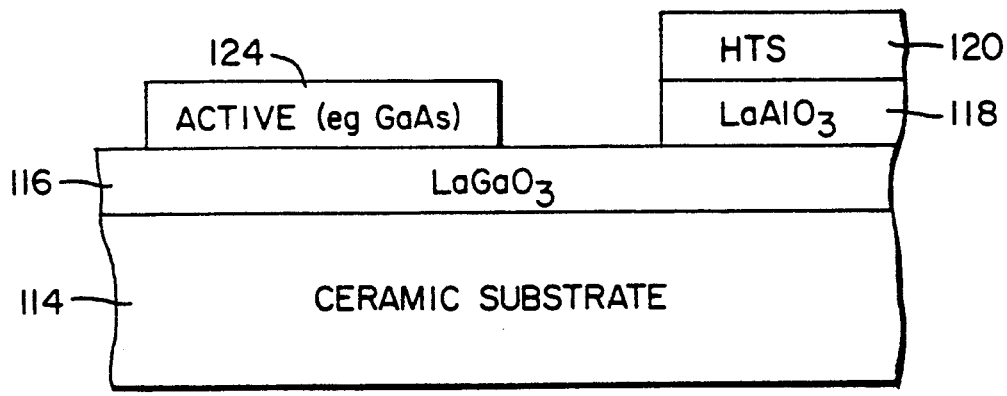

FIGS. 9-11 show a processing technique for depositing a single crystal compound semiconductor active layer on a ceramic substrate for integration of active components, and a single crystal HTS layer on the same substrate for integration of passive components. Ceramic substrate 114 has an LaGaO$_3$ buffer layer 116 epitaxially grown thereon. An LaAlO$_3$ buffer layer 118 is epitaxially grown on layer 116. An HTS layer 120, preferably YBaCuO or TlBaCaCuO, is epitaxially grown on layer 118. A portion of layer 120 and layer 118 therebelow is etched away to expose a portion 122 of layer 116, FIG. 10. Active semiconductor layer 124, FIG. 11, preferably GaAs, is epitaxially grown on exposed portion 122 of layer 116. Alternatively, the buffer layer structure 24 of FIGS. 2 or 3 is epitaxially grown on exposed portion 122 of layer 116, followed by epitaxial growth of layer 124. Layer 124 provides an active semiconductor layer for integration of active components as noted above. HTS layer 120 provides a passive layer for integration of passive components as noted above. YBaCuO and TlBaCaCuO each have a lattice constant of 3.8 for HTS layer 120. The lattice constants of LaGaO$_3$ and LaAlO$_3$ are 5.5 and 3.7, respectively, and provide transitional lattice constant matching between ceramic substrate 114 and HTS layer 120.

Figure 12:
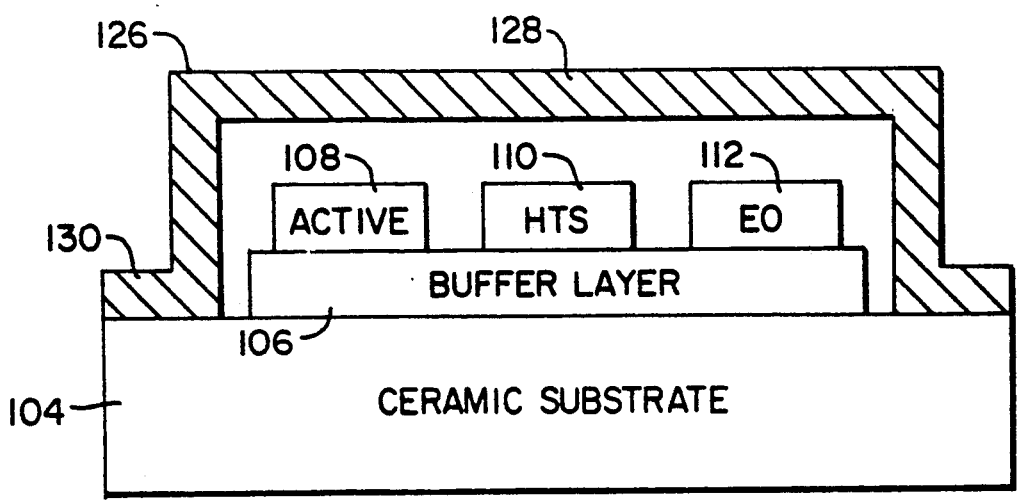
FIG. 12 shows a further embodiment.

FIG. 12 shows a further embodiment of FIGS. 1 and 8 including a metal cover 126 having a first portion 128 over layers 108, 110, 112, and a second outer portion 130 engaging ceramic substrate 104. Cover 126 and ceramic substrate 104 are pre-oxidized and then heated, or are heated in an oxidizing atmosphere, to form a eutectic which wets substrate 104. Cover 126 and substrate 104 are then cooled, with cover portion 130 directly bonded to substrate 104. This provides desirable hermetic sealing. Direct eutectic bonding is known in the art, and further reference may be had to U.S. Pat. Nos. 3,744,120, 3,766,634, 3,854,892, 3,911,553, 3,993,411, 3,994,430, and 4,129,243, incorporated herein by reference.

As known in the art, in the development of MMICs to date, the semiconductor material of choice has been group III-V compounds, preferably GaAs and InP. The present invention provides new methods and structures for bonding group III-V compound element semiconductor layers to the surfaces of ceramics, including metal oxide substrates. A low temperature, impurity-free technique is provided for depositing GaAs onto ceramic. The low temperature method prevents diffusion problems otherwise associated with high temperature material deposition techniques. A significant advantage of the present invention is an increase in thermal conductivity due to a reduction in thickness of the GaAs, particularly elimination of the semi-insulating layer portion thereof, which has poor thermal conductivity. Another advantage is the elimination of the need for epoxy or solder bonding to a chip carrier which can result in chip fracture of high powered devices due to mechanical stresses caused by mismatched thermal expansion coefficients. Another advantage is the hermetic sealing enabled by the invention in accordance with known direct eutectic bonding techniques.

Figure 23:
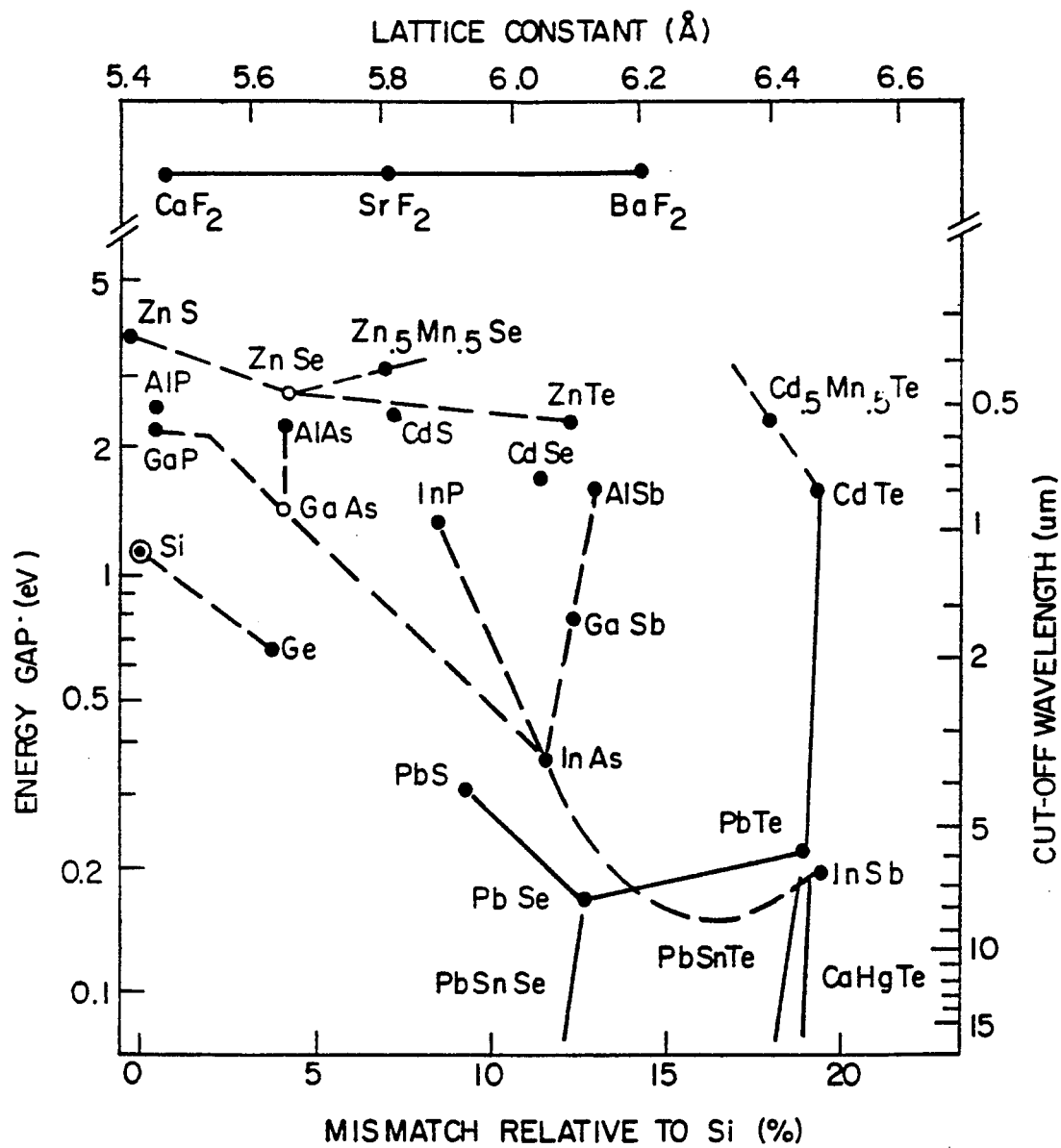
FIG. 23 is lattice constants of semiconductors and IIa fluorides relative to Si vs. bandgaps of the semiconductors.

As known in the art, compound element semiconductors and their heterojunctions are desirable because they yield high speed, high frequency transistors. Early research concentrated on the growth of heterojunctions using lattice matched semiconductor crystals. The need for lattice matching had been assumed critical to avoid dislocations and other electrically active imperfections. However, it has been found that mismatched materials can be grown that are device quality without performance degradation due to dislocations. Hence, the range of materials and their heterojunctions that can be potentially useful is much wider with the use of lattice mismatched semiconductors, FIG. 23. Many electronic devices will exhibit comparable or superior performance through the use of materials which are not matched to the host substrate. For example, the use of Ga$_{.47}$In$_{.53}$As/Al$_{.48}$In$_{.52}$As grown 4% mismatched to GaAs for the modulation doped field effect transistor has been demonstrated to have comparable performance to the growth of this structure lattice matched to InP, "A High Performance 0.12 $\mu$m T-Shape Gate Ga$_{0.5}$In$_{0.5}$As/Al$_{0.5}$In$_{0.5}$As MODFET Grown by MBE Lattices Mismatched on A GaAs Substrate", Y.K. Chen et al, IEDM 431-434 (Dec. 1986), and "0.1-$\mu$m Gate Al$_{0.5}$In$_{0.5}$As/Ga$_{0.5}$In$_{0.5}$As MODFET Fabricated on GaAs Substrates", G.W. Wang et al, IEEE Trans. Electron Devices 35 (7) 818-823 (1988).

GaAs has many disadvantages as a substrate. It is expensive, brittle compared to silicon, and a poor thermal conductor. Since most of the active region of the devices fabricated are found in less than the top 1% of the final wafer, it would be very desirable to find a replacement for this substrate. The use of substrates which are not lattice matched to the epitaxial device structures opens another degree of freedom in choosing technologies for integration. This opens the door towards the possibility of choosing materials based on their intrinsic properties and those of their heterojunctions, rather than on the availability of a suitable substrate. The strongest candidate for mismatched growth on an optimum substrate is the growth of GaAs on an insulating substrate with good thermal conductivity.

In spite of the 13% lattice mismatch between GaAs and sapphire, their thermal expansion coefficients are very close in value. This property is important for device applications. Notwithstanding the lattice mismatch, single crystal GaAs was grown on sapphire substrates. Samples were evaluated using Raman scattering (RS) and photoreflectance (PR). The RS and PR data is shown in FIGS. 13-22. The polarization selection rules of the RS indicated that sample #1, FIGS. 13-15, (rapidly quenched from heat treatment) has a (110) orientation, while samples #2, 3 and 4, FIGS. 16-7, 18-19, and 20-22, respectively, (slowly downramped from heat treatment) have the (111) configuration. Epitaxial layers grown at 400° C. were specular and defect free. However, if substrate temperatures were raised to the standard GaAs growth temperature of 600° C., surfaces were quite hazy. A high temperature outgas, several arsenic surface priming steps and superlattice of InAs/GaAs were used preceding the GaAs growth sequence. Growth was initiated at low temperature (400° C.) at a slow growth rate (0.2 μm/hour) and gradually accelerated to 0.8 μm/hour over 0.6 μm of epitaxy.

Czochralski-grown (0001) (c-plane or bazel-plane) and (01-12) (r-plane) sapphire substrates were used. The substrates were first degreased in organic solvents and then lightly etched in $H_2SO_4$ and HF. They were then soaked and rinsed in DI water and blown dry with nitrogen gas. The substrates were then mounted on indium-free mounting blocks and loaded into the preparation chamber of the MBE. To reduce surface disorder, the wafers were heat treated at 800° C. for 5 minutes. Of the four samples studied, sample #1 was rapidly quenched from the high temperature heat treatment. Samples #2-#4 had the substrate temperature slowly ramped to 350° C. This difference in procedure was to have a direct impact of the crystal orientation of the epitaxial growth that was to follow. Before the growth initiation, an arsenic prelayer was supplied to the sapphire surface of all samples.

The growth of GaAs was initiated at low temperature (400° C.) at a rate of 0.2 μm/hour. A 10 period InAs/GaAs superlattice was used to initiate the growth at the GaAs/sapphire interface. After 0.2 μm of growth of GaAs the growth rate was increased to 0.4 μm/hour and an additional 0.4μm was grown. On the completion of growth of the first 0.6 μm, the growth rate was increased to the standard 0.8 μm/hour for the remainder of the growth sequence. On samples #1 and #2 (bazel-plane), and #4 (r-plane) the growth temperature was increased to 600° C. after the first 2 μm of growth. Sample #3 (bazel-plane) was grown at 400° C. for the entire epilayer thickness. The GaAs epitaxial layer thickness of all samples measured approximately 0.6 μm. Surface morphology was found to degrade rapidly with the increase in substrate temperature. Accordingly, the surface of samples #1, #2, and #4 were quite hazy. The morphology of sample #3 was specular and defect free.

Raman scattering (RS) was studied from four samples of GaAs/Sapphire grown by MBE. Samples #1-#3 were grown on bazel-plane substrates. Sample #4 was grown on r-plane. The measurements were made at 300 K in the back-scattering geometry using the 5145 A line of an Ar-ion laser. For sample #1 and #4 measurements were also taken using the 4880A line. The power was about 700 mW.

Shown in FIGS. 13, 14, 16, 18, 20, 21 are the RS spectra of the samples (#1-4) in the region of the transverse (TO) and longitudinal (LO) q=O optical phonons of GaAs. The instrumental resolution was 2 $cm^{-1}$. The positions of these phonons should be 269 $cm^{-1}$ and 292 $cm^{-1}$. Since RS is a second order process, there are polarization selection rules. For example, in backscattering RS for the (100) surface only LO is allowed, from (110) only TO is allowed while from (111) both TO and LO should be seen. These selection rules apply for material doped less than about $1 \times 10E17$ $cm^{-3}$.

Figure 13:
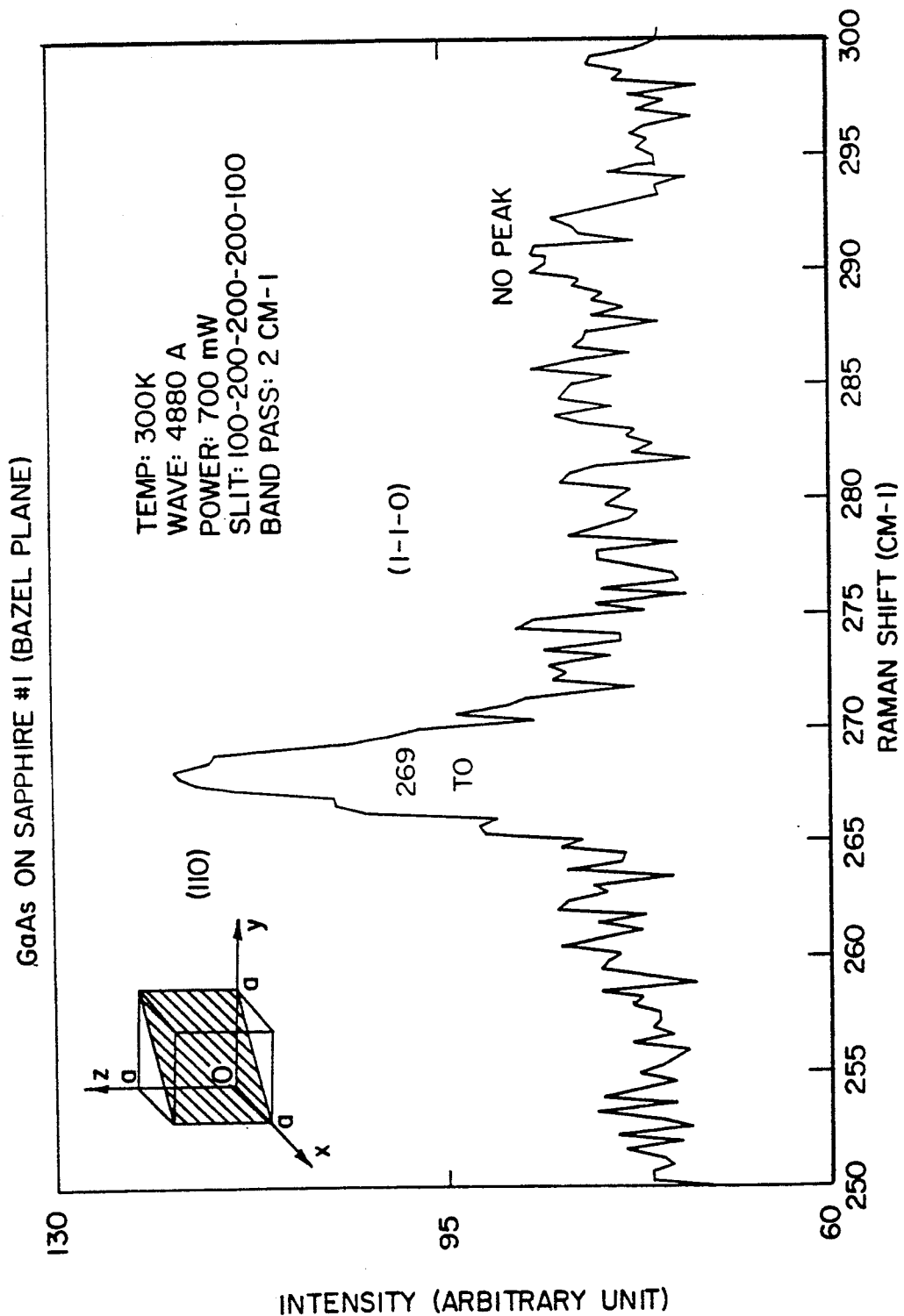
FIGS. 13-22 are graphs showing Raman scattering (RS) and photoreflectance (PR) data.
Figure 14:
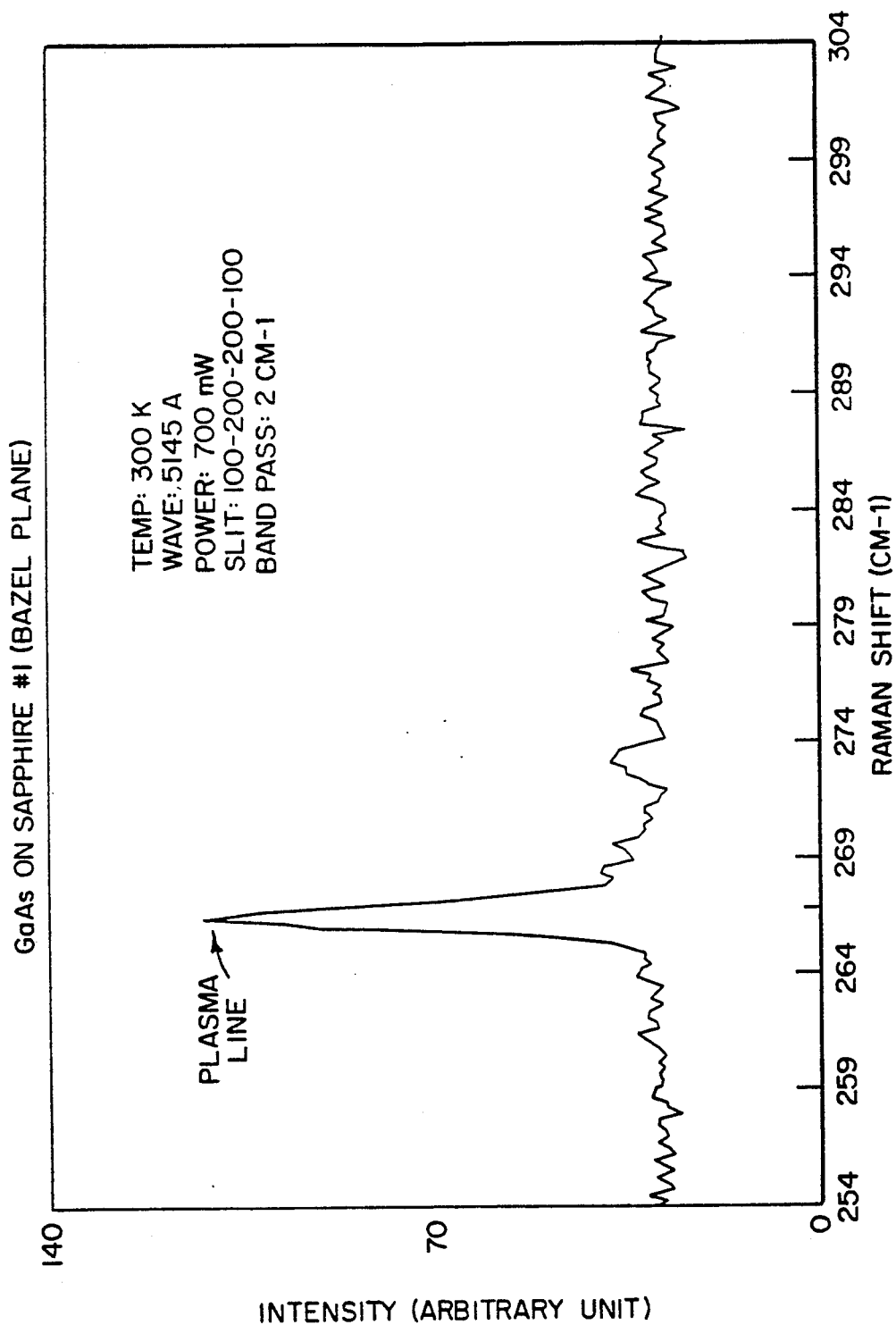
Figure 16:
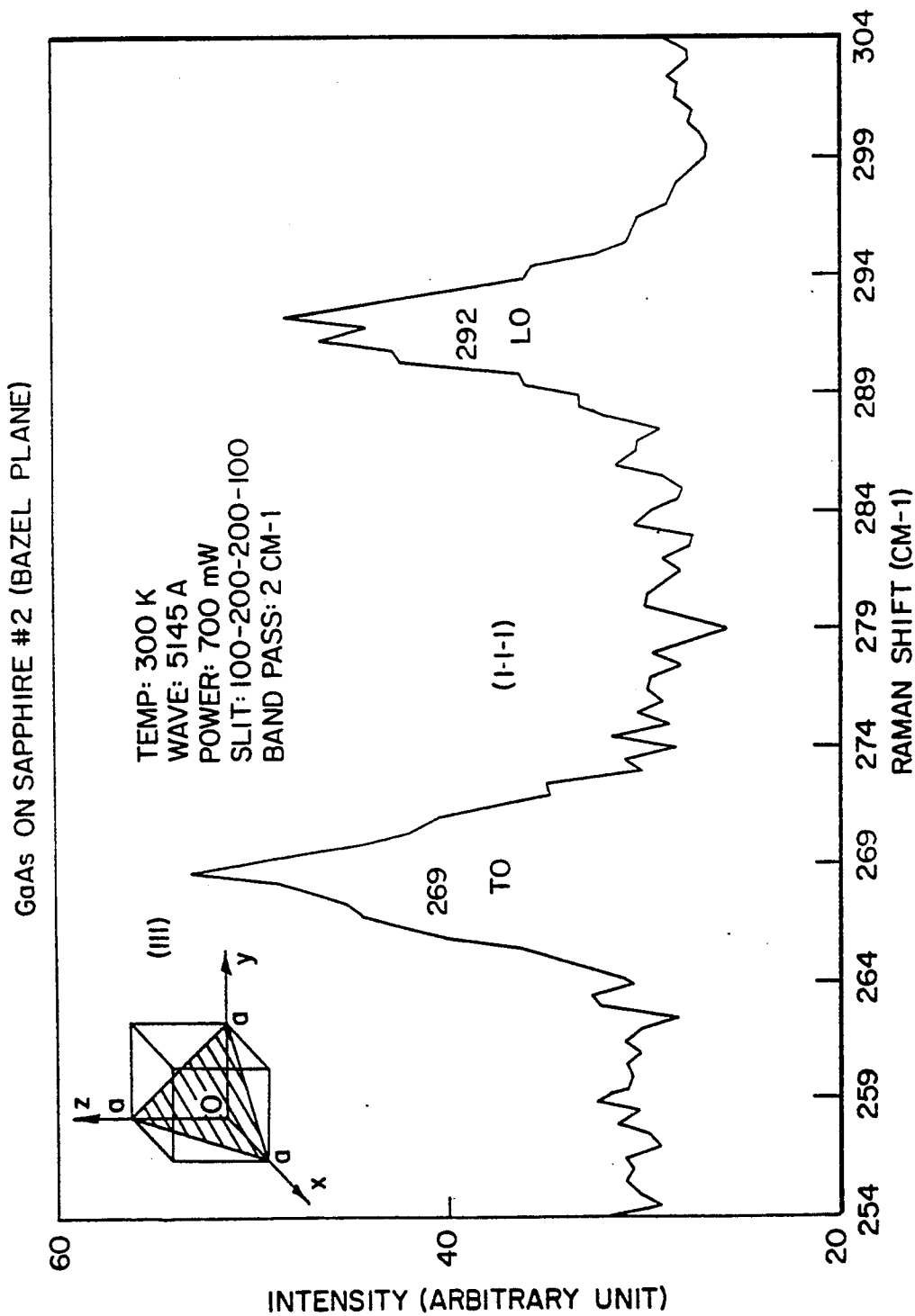
Figure 18:
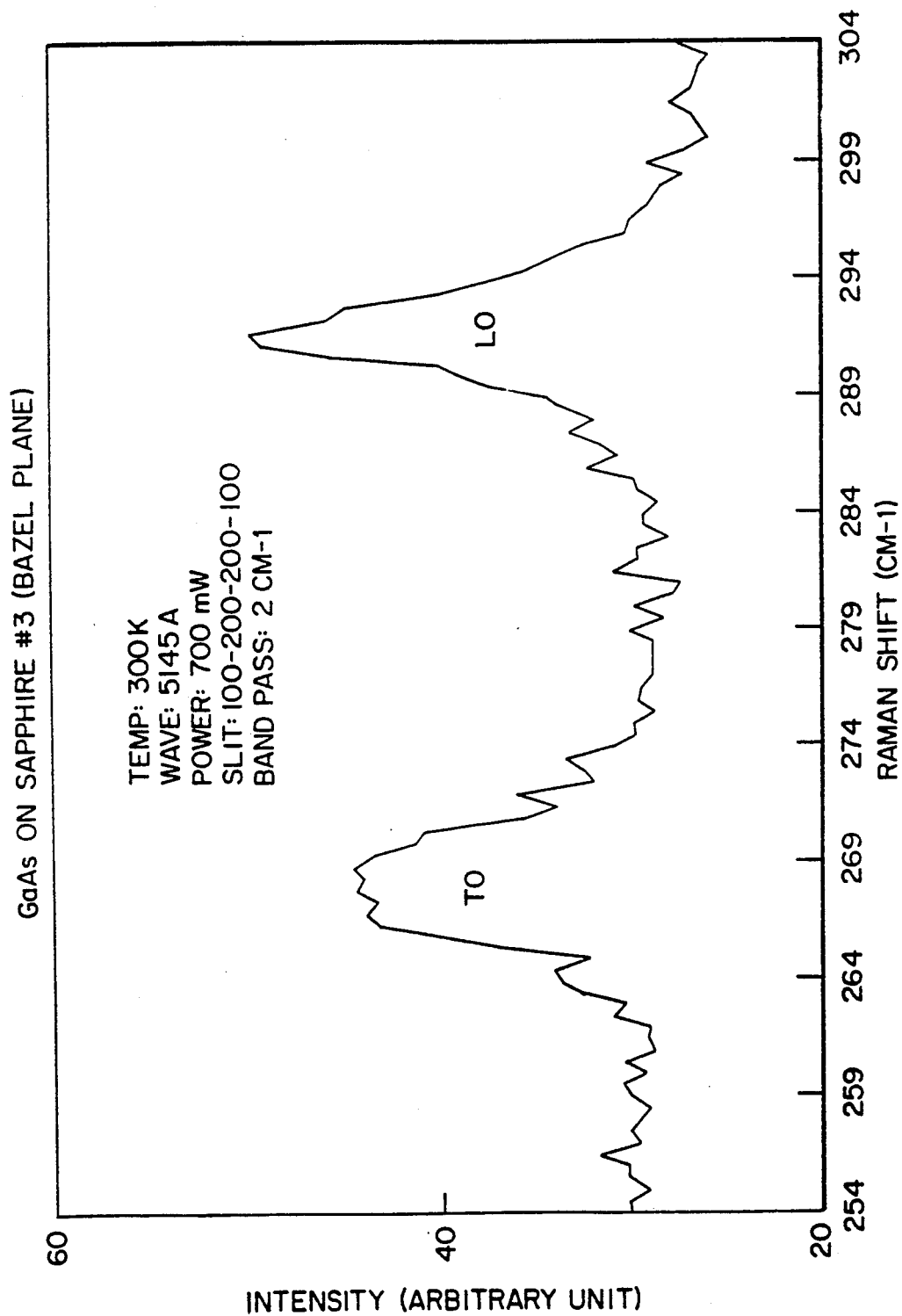
Figure 20:
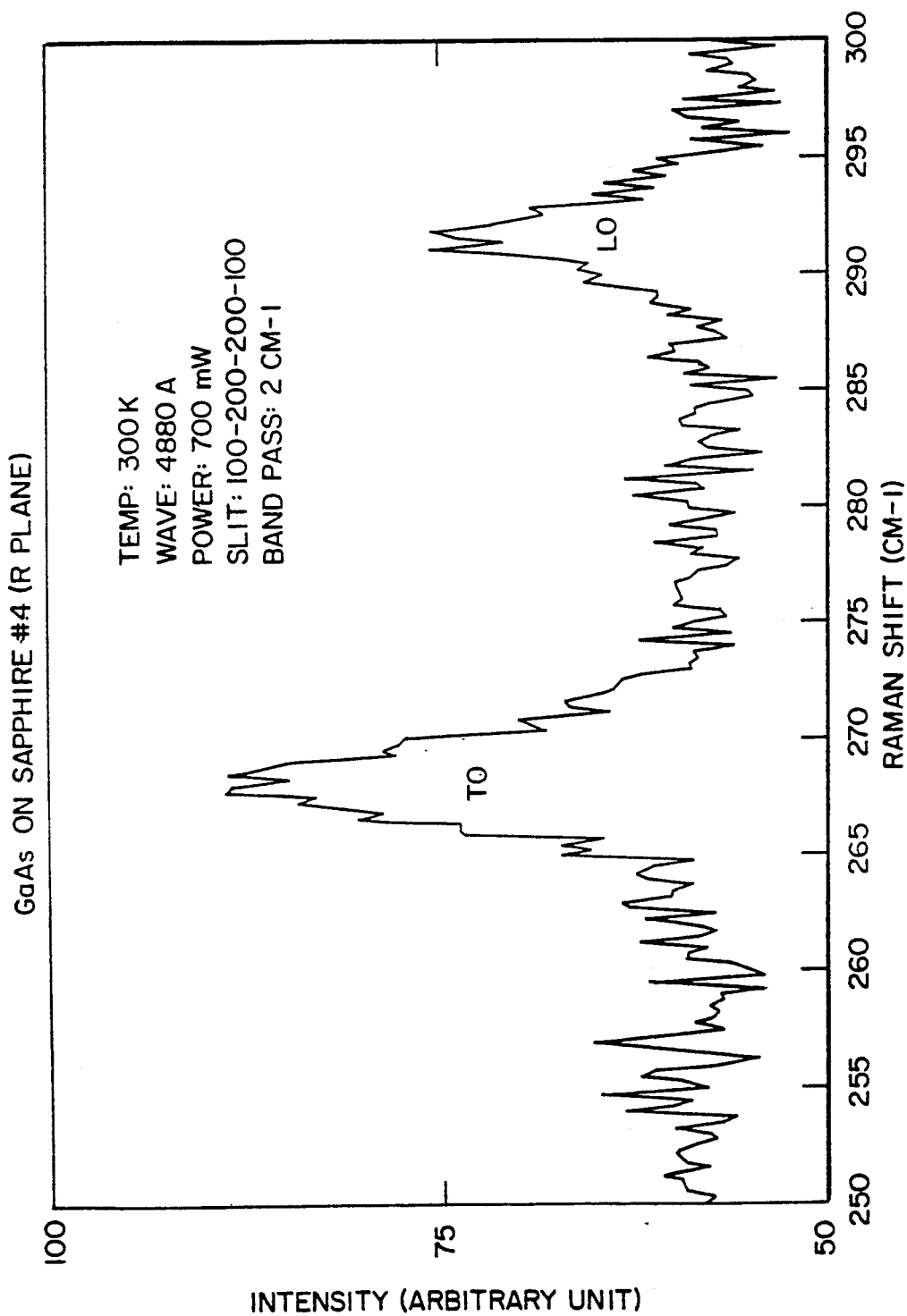
Figure 21:
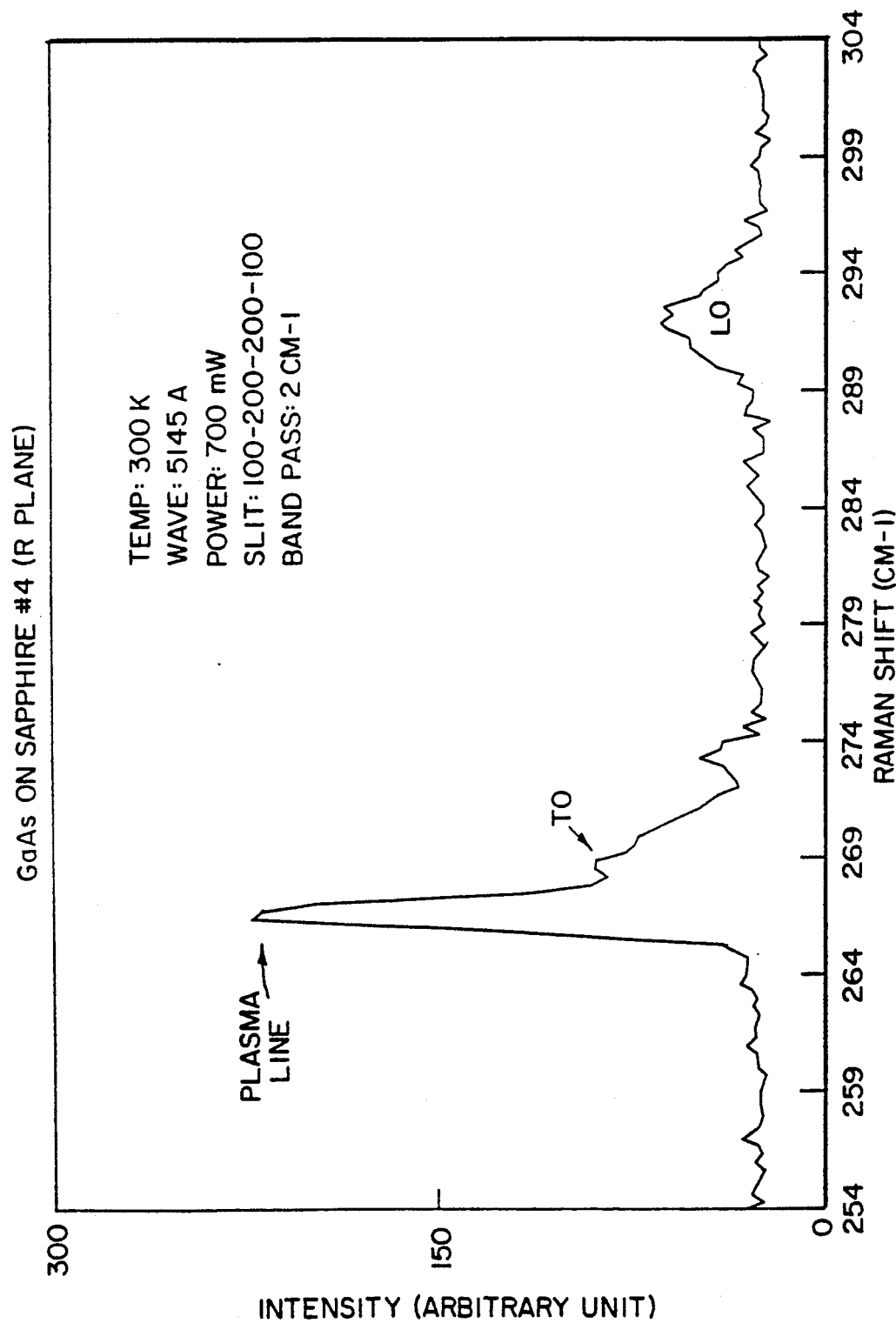
Figure 22:
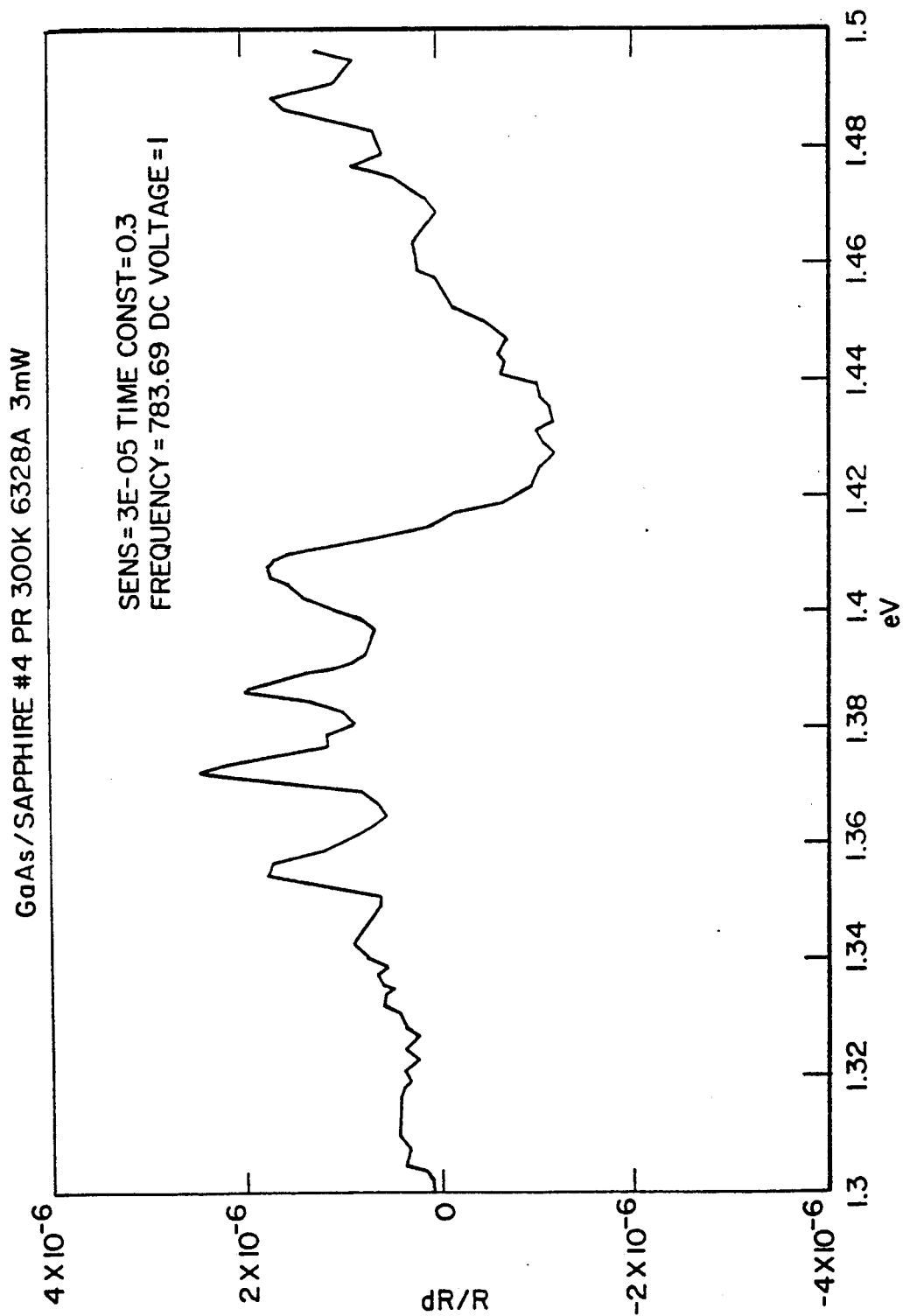

In FIG. 14, RS spectra of sample #1 (bazel-plane), using 5145 A, there is a very narrow peak at 267 $cm^{-1}$. While at first glance one might assign this to the TO peak (269 $cm^{-1}$) it is actually a plasma line. In FIG. 13, using 4880 A on the same sample, there is indeed a peak at $269^{-1}$. The linewidth of the 269 $cm^{-1}$ peak is about 3 $cm^{-1}$. FIG. 16 (5145 A) is the RS spectra of sample #2 (bazel-plane). There are two peaks at 269 $cm^{-1}$ and 292 $cm^{-1}$ with linewidths of about 5 $cm^{-1}$. These are the TO and LO phonons, respectively. FIG. 18 (5145 A), RS sample #3 (bazel-plane), has a spectra comparable to FIG. 16. In FIG. 21, RS spectra of sample #4, the data shows a sharp peak at 267 $cm^{-1}$, the same position as in FIG. 14, a shoulder at 269 $cm^{-1}$ and another peak at 292 $cm^{-1}$. The latter two correspond to the TO and LO phonons of GaAs. FIG. 20 is the RS data for sample #4 (r-plane) using 4880 A. The TO and LO peaks are well defined. It is believed that the sharp line at 267 $cm^{-1}$ in FIGS. 14 and 21 is a plasma line from the Ar-ion laser that got through the interference filter.

FIGS. 13, 16, 18, 20 and 21 show conclusively the presence of reasonable quality GaAs in all four samples. Very good crystalline GaAs has a Raman linewidth of about 3 $cm^{-1}$. The material of the samples shown in FIGS. 18 and 20 have a linewidth of about 5 $cm^{-1}$. Since for sample #1 (FIG. 13) we observe only TO we conclude that this is in the (110) configuration. For samples #2, #3, and #4 we see both TO and LO and hence these materials are in the (111) orientation.

Figure 15:
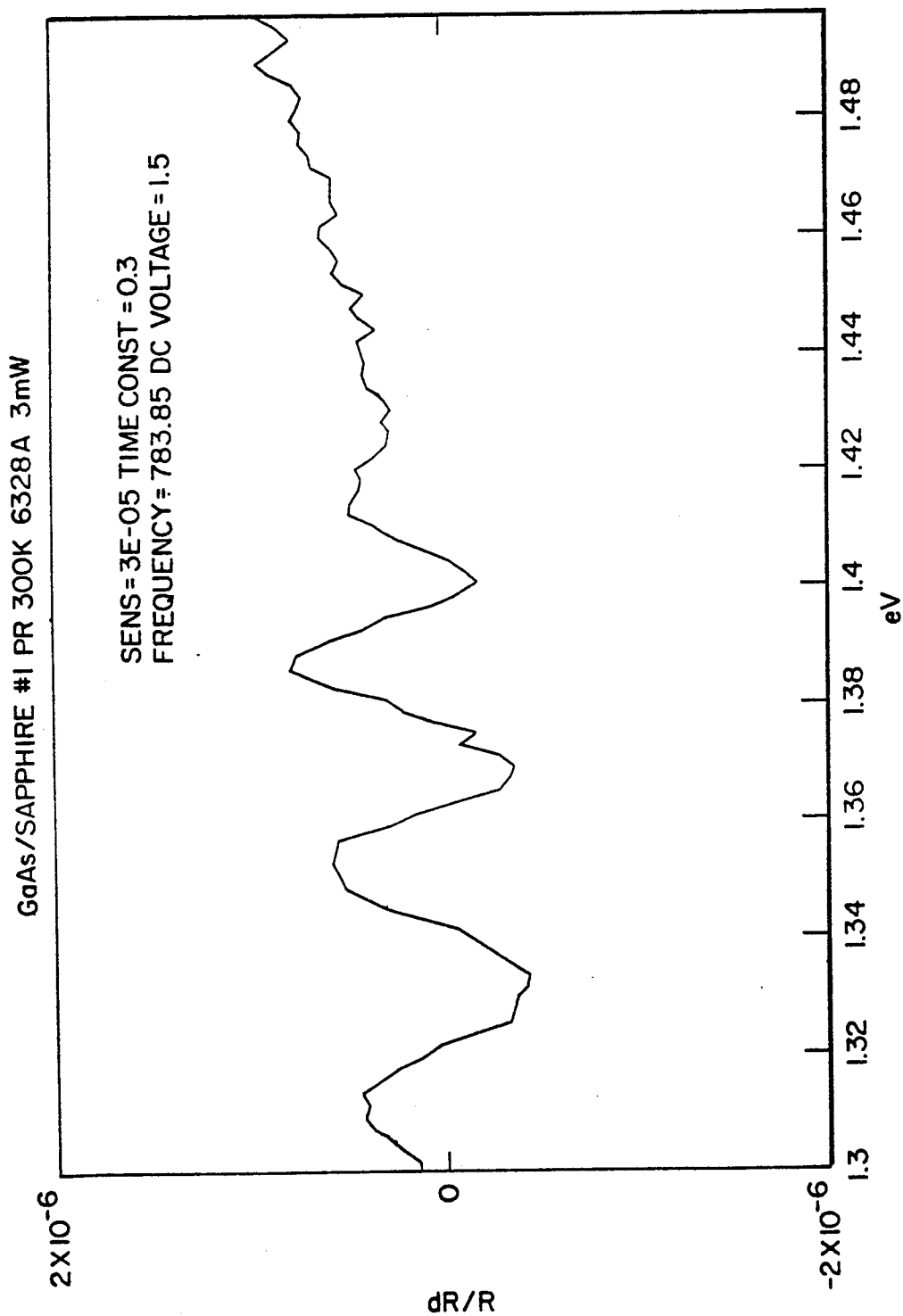
Figure 17:
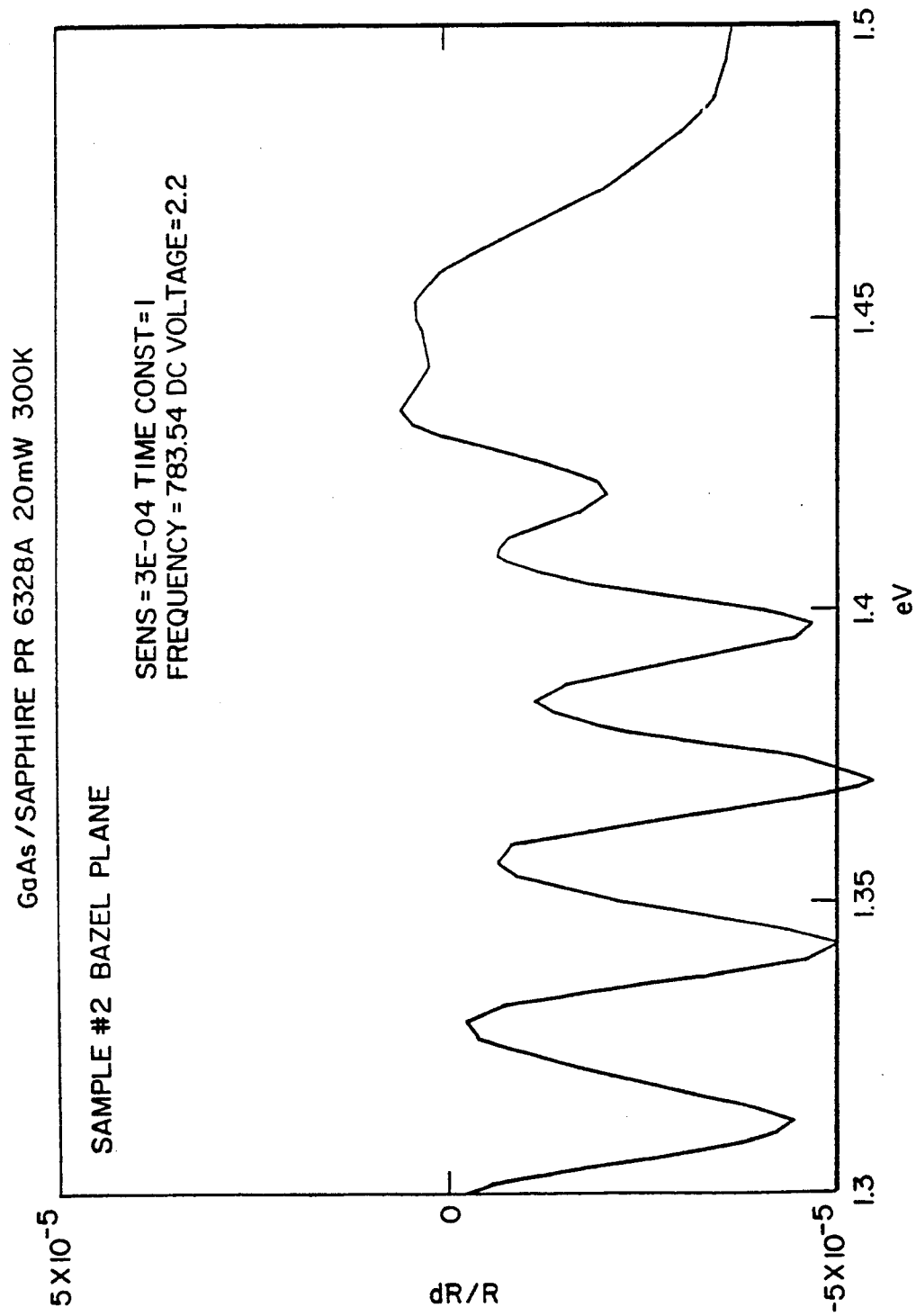
Figure 19:
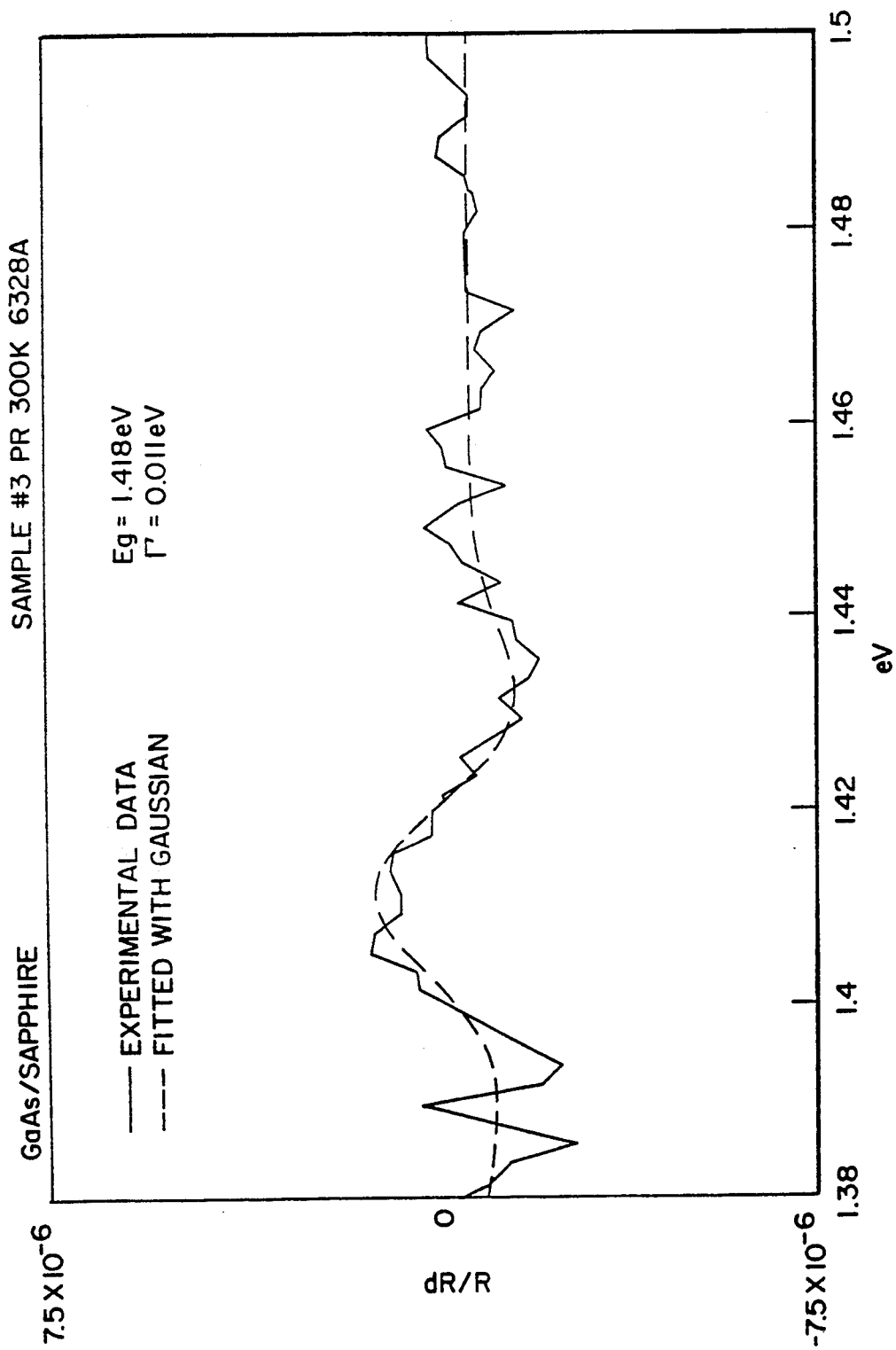

We have also measured the photoreflectance in samples #1-4. The pump beam was the 6328A line of a 5 mW He-Ne laser. The solid lines in FIGS. 15, 17, 19, 22 show the experimental PR spectra in the vicinity of the direct band gap ($E_o$) of GaAs. This should appear at 1.43 eV. FIG. 15 (sample #1) exhibits interference fringes below 1.42 eV. These fringes damp out above 1.42 eV. There is a strong absorption but no clear evidence for an $E_o$ peak. FIG. 17 (sample #2) also shows interference fringes below 1.42 eV but there is a well defined peak beginning at about 1.42 eV which is probably $E_o$. FIG. 19 (sample #3) exhibits the most well defined peak. The dashed lines are a least squares fit to the first derivative of the Gaussian lineshape function The energy of the $E_o$ peak is 1.418 eV with a linewidth of 11 meV. This linewidth is quite good. Bulk GaAs has linewidths of about 8-10 meV while very good quality epi material has linewidths as narrow as 4 meV. The spectrum of FIG. 22 (sample #4) is comparable to FIG. 17. Interference fringes are seen below 1.42 eV with peak at about 1.42 eV.

Both the RS and PR data show that all four samples are indeed GaAs of reasonable quality. The polarization selection rules of the RS indicate that sample #1 (rapidly quenched from heat treatment) has a (100) orientation while sample #2, 3 and 4 (slowly downramped from heat treatment) have the (111) configuration.

In the fabrication of MMICs, the desirable properties of ceramics include high thermal conductivity, high resistivity, optical transparency, and low loss and low dielectric constant. The benefits of the present invention, including fabrication of GaAs on ceramic include: higher operating temperature capability; increased reliability; considerable packaging simplification; realization of additional capabilities by integrating semiconductors, HTS thin films and opto-electronic devices; elimination of bonding chips to carriers; MMICs without VIAs; hermetic sealing capability; fabrication at a reduced cost; increase in chip yield; high resistivity substrates; and a totally new technology approach to MMIC fabrication. The strongest candidate for mismatched growth on an optimum substrate is the growth of GaAs on an insulating ceramic substrate with good thermal conductivity. GaAs and related compounds, including AlGaAs and strained layer GaInAs, are the ideal candidates for the fundamental growth of mismatched materials because the electrical and optical properties of these materials are critical to high speed electronic and photonic devices, and these devices and related MMICs can be improved in performance and reliability with an improved choice of substrate.

The problem of mismatched growth of semiconductors on ceramics can be solved using a similar plan of attack which has been applied to the growth of mismatched layers. Studies to date have shown that layers of compound semiconductor material can be grown epitaxially on crystalline substrates with dissimilar lattice constants. The lattice constant of the grown layers is initially forced to be the same as that of the substrate. This deviation from the normal lattice constant is elastic, with no broken bonds, if the stress does not exceed certain limits. If the layer is grown too thick, the stress is excessive and dislocations form to relieve the stress. These dislocations, when present in GaAs or GaInAs grown mismatched to a substrate, usually act as electrically active electron traps. The presence of these traps must be avoided for majority carrier devices as MESFETs and MODFETs using electrons (low mass, high velocity carriers) for conduction. Three different techniques can be utilized to resolve the generalized problem of mismatched growth.

The first technique for accommodating a mismatch between the ceramic substrate and the semiconductor is to grow thick buffer layers of the desired lattice constant mismatched to the insulating ceramic substrate. When sufficiently thick buffer layers are employed, dislocation densities will drop to low levels and a new lattice constant can be established. Dislocations tend to act as electron traps which reduce the conductivity of n-type layers. For example, InAs has been successfully grown on lattice mismatched GaAs and characterized by two different means. First, it has been found that InAs on GaAs will have a lattice constant which is nearly that of GaAs for thin layers ($<100A$), and will eventually have the same lattice constant of InAs after growing InAs layers of 1000 A thick. The electrical properties of n-type InAs grown 2000 A thick on GaAs show sufficiently high carrier densities that very low resistivity ohmic contacts have been successfully obtained. In a similar situation anti-phase domains have been identified as the major problem for the growth of GaAs on Si. A number of different schemes to assist in the initial growth of GaAs on Si have been employed to reduce the anti-phase problem.

At the outer limits of the amount of mismatch which has been attempted is the growth of InSb on GaAs conducted by Universities and industry. It has been found that the mobility of InSb layers grown on GaAs improves with increased thickness of the InSb layer. A modified approach to establishing a new lattice constant is realizable through the use of graded composition buffer layers of appropriate material.

The second technique of reducing dislocations resulting from mismatch is the use of intermediate layers of lattice constants which result in compressive stress. The growth of layers whose lattice constant is larger than that of the substrate results in compressive stress which is effective in turning the lattice mismatch dislocations in a direction parallel to the interface between the two materials, and these dislocations will remain confined at the location of the interface. This effect occurs for thin layers which have small values of mismatch ($<2\%$). It is, however, possible to grow a series of single layers of increasing constant, each turning mismatch dislocations to the wafer edge. Device quality structures have been demonstrated using this technique. $Ga_{.47}In_{.53}As$ has been grown on GaAs using increasing mole fraction interlayers. This technique is applicable to resolve the general problems of establishing a new lattice constant.

Yet another approach to lattice mismatched growth is to grow a superlattice of the desired lattice constant mismatched to substrate. This technique has been used successfully in reducing dislocation propagations in GaAs on Si where AlGaAs/GaAs superlattice has been adopted, and also in the growth of GaInAs on GaAs.

The buffer layer has varying concentrations of elements, as noted above. For example, the GaInAs layer has varying concentrations of Ga and In, i.e. $Ga_{1-x}In_xAs$, where x varies. Likewise, the AlInAs layer has varying concentrations of Al and In, i.e. $Al_{1-y}In_yS$, where y varies. Similarly, the other buffer layers, such as $CaF_2$, $SrF_2$, $BaF_2$, $LaGaO_3$, $LaAlO_3$, etc., have varying concentrations of elements.

Studies have been conducted in the prior art into the nature of the electrical properties of GaInAs grown on GaAs and the interface between the two materials. Pseudomorphic structures (the critical thickness is not exceeded) exhibit very good electrical quality of GaInAs and its interface with GaAs. It was found that when dislocations result from exceeding a critical thickness they form an electron trap which is located predominantly at the interface. However, the electrical properties of the GaInAs layer at a distance of 1000 A or more from the interface are not seriously degraded by the presence of the dislocations below. Similar behavior was observed for growth of InAs on GaAs for very low resistivity ohmic contacts to InAs. In another study involving InAs on GaAs it was found that the transitional layer would have a lattice parameter which was close to GaAs for thin layers and equal to that of InAs for thick layers. These observations have led to the successful growth of single lattice constant structures which are mismatched to a substrate. The above study was directed at establishing a new lattice constant such that the heterojunctions could be grown lattice matched to each other for application to MODFET structure. The compositions of AlInAs and GaInAs were chosen to be nearly equivalent to those which lattice match InP so that device performance could be compared to structures lattice matched to the substrate. The thicker buffer layers can be shown to have produced wide areas of material where dislocations are completely absent. The surface is essentially featureless. We can conclude from these findings that given optimized growth and material conditions, dislocations can be completely eliminated from AlInAs/GaInAs grown on GaAs through the use of a lattice matched superlattice of AlInAs/GaInAs.

Heterostructure devices grown lattice matched to a suitable substrate have established high levels of performance for high speed electrical and optical applications. The use of Molecular Beam Epitaxy (MBE) has made it possible to fabricate Modulation Doped Field Effect Transistors (MODFETs) made from AlGaAs/GaAs grown on GaAs substrates and from AlInAs/GaInAs grown on InP substrates. The best level of microwave performance obtained from AlGaAs/GaAs MODFETs is the achievement of a unity current gain cutoff frequency ($f_T$) of 116 GHz for a device with a gate length of 0.25 μm.

There is a need for high speed devices for millimeter wave integrated circuit (MMIC) applications using GaAs technology, including AlGaAs/GaAs MODFETs. The growth of strained layers improves the conduction band discontinuity between high and low bandgap materials. When thin layers of slightly lattice mismatched (<2%) materials are grown by MBE, the strain introduced by the mismatch can be accommodated elastically by damage free lattice distortion. These structures are termed either strained layer, or pseudomorphic. An investigation of the electrical properties of these strained layers has found that the layers and interfaces are free of electrically active centers associated with the strain. If strain beyond the critical thickness is attempted, misfit dislocations form to accommodate the strain between the materials. The misfit dislocations form an electron trap which can pin the Fermi level when they are present in sufficient density.

The addition of In to the GaAs MODFET channel has been shown to improve device performance through the increased conduction band discontinuity between GaInAs and AlGaAs. Improved carrier confinement in the strained layer GaInAs channel has led to device performance characterized by $f_T$ values of 53 GHz at 0.35 μm gate length, 65 GHz for 0.25 μm gate length, and 154 GHz for <0.15 μm gate length. The improvement seen in the last result compared to previous work with GaInAs channels is due to the successful use of the highest mole fraction of In for the channel which could be obtained without severe electrical degradation. Although this value of $f_T$ represents the best results of a MODFET with an AlGaAs carrier supplying layer, it represents the limit which is likely to be obtained in this system. Superior results would be expected in the AlInAs/GaInAs system where the conduction band discontinuity between the materials and the velocity of the channel material are superior to the useful compositions which lattice match, or are pseudomorphic to, the GaAs substrate.

Growth of the various structures by MBE (molecular beam epitaxy) is desirable for a number of reasons. First, MBE avoids the use of toxic source gases which require extensive, and expensive, facilities to reduce the danger to personnel. Second, MBE does not require any special modifications or choice of growth conditions to obtain the highest control of growth rates and compositions which are problems encountered in either MOMBE (metal organic molecular beam epitaxy) or MOCVD (metal organic chemical vapor deposition). MOCVD is beginning to demonstrate large area uniformities which make it competitive with MBE, but MOMBE faces serious problems in reproducible growths, especially for ternary materials which are essential for microwave and millimeter applications.

The growth of ternaries by MOMBE is complicated by the fact that growth rate is a strong function of both incident flux and substrate temperature. The measurement of substrate temperature is an especially difficult problem in MBE (and its gas source derivative MOMBE) environments. Measurement of substrate temperature by a substrate thermocouple is prone to severe errors of up to 100 C which varies during growth. Pyrometer measurements of substrate temperature are complicated by the absorption of light used to determine temperature to different extents by the different materials grown.

The solution to unique measurement of temperature is through observation of surface reconstruction using in-situ Reflection High Energy Electron Diffraction (RHEED). This measurement permits establishment of an extremely accurate reference point (congruent sublimination temperature) for scaling of thermocouple and pyrometer measurements. This technique is accurate enough for MBE growth where growth conditions are chosen to take place in substrate temperature regions where compositions and growth rates are not a function of substrate temperature. These are the usual temperature regions for most materials by MBE. This accuracy is not sufficient to reproduce ternary growth compositions by MOMBE.

Use of RHEED measurements represents the major advantage of MBE over MOCVD as a growth deposition technique. The shallow angle diffraction of a 10 KeV electron beam from the surface of the growing wafer onto a phosphor screen for observation is an extremely powerful tool in determining the best growth conditions, insitu, and in a single growth. It is possible to use RHEED to determine the relative Ga to As ratios in the growth of GaAs and adjust the fluxes to optimize the growth of this and other compounds. This capability will be essential to the growth of GaAs on ceramics where the critical first few atomic layers can be observed. If the growth conditions are found to be yielding unsuitable quality as determined by RHEED, it will be possible to stop the deposition, heat the substrate above the congruent sublimation temperature for GaAs, desorb the few monolayers deposited, and begin a completely new growth. In this way, it may be possible to initiate a large number of growths in a single day to observe material quality through observation of surface reconstruction by RHEED. There is no analogous technique which can be performed in-situ by MOCVD, thus an attempt to perform this study by MOCVD would require the very time consuming and expensive process of growing a large number of wafers to obtain the information which can be obtained by MBE in a single day.

RHEED offers one more important capability which cannot be performed in MOCVD, namely in-situ growth rate measurements. The intensity of RHEED patterns can be seen to oscillate with a period which is a direct measure of the number of monolayers per second which are growing. This capability is essential for calibration accuracy of growth rates to approximately 1%. Since this calibration can drift over a several day period, it is possible to re-establish calibration to the 1% level in a few minutes prior to growth of structures where thickness and composition control are essential. The application of extremely accurate growth rate determination is essential to the application of monolayer growth techniques such as migration enhanced epitaxy which will be essential to the growth of semiconductors on ceramics.

Therefore, the growth of GaAs and related compounds on ceramic is best accomplished by MBE. The initiation of growth can be carefully monitored by RHEED and monolayer growths for initiation of buffer layers can be accurately controlled by in-situ growth measurements. The initial growth of mismatched materials has been shown to be the most critical parameter in establishing growth of high quality materials.

It is recognized that various equivalents, alternatives and modifications are possible within the scope of the appended claims.

We claim:

1. A semiconductor device having a single crystal compound element active semiconductor layer on a ceramic substrate for integration of active components, and a passive layer on the same said substrate for integration of passive components, comprising:
    a ceramic substrate;
    a first semi-insulating buffer layer epitaxially grown on said ceramic substrate, said first buffer layer having a lattice constant substantially matching the lattice constant of said active layer;
    a second semi-insulating buffer layer epitaxially grown on said first buffer layer, said second buffer layer having a lattice constant substantially matching the lattice constant of said passive layer,
    wherein said passive layer is epitaxially grown on said second buffer layer, and said active layer is epitaxially grown on said first buffer layer, to provide both active and passive layers monolithically integrated on said ceramic substrate.

2. The invention according to claim 1 wherein said passive layer and said second buffer layer therebelow have an etched portion to expose a portion of said first buffer layer, and wherein said active layer is epitaxially grown on said exposed portion of said first buffer layer.

3. The invention according to claim 1 wherein said passive layer is a high temperature superconductor, HTS, layer.

4. The invention according to claim 3 wherein said HTS layer is selected from the group consisting of YBaCuO and TlBaCaCuO.

5. A semiconductor device having a single crystal active semiconductor layer on a ceramic substrate for integration of active components therein, and a single crystal high temperature superconductor, HTS, passive layer on the same said ceramic substrate for integration of passive components therein, comprising:
    a ceramic substrate;
    a $LaGaO_3$ layer epitaxially grown on said substrate;
    a $LaAlO_3$ layer epitaxially grown on said $LaGaO_3$ layer;
    a high temperature superconductor, HTS, layer epitaxially grown on said $LaAlO_3$ layer;
    a compound element active semiconductor layer epitaxially grown on said $LaGaO_3$ layer.

6. The invention according to claim 5 wherein said HTS layer and said $LaAlO_3$ layer therebelow have an etched away portion to expose a portion of said $LaGaO_3$ layer, and wherein said compound element active semiconductor layer is epitaxially grown on said exposed portion of said $LaGaO_3$ layer.

7. The invention according to claim 5 wherein said HTS layer is selected from the group consisting of YBaCuO and TlBaCaCuO.

8. The invention according to claim 5 comprising a superlattice-strained-structure of sequential layers of GaInAs and AlInAs between said $GlGaO_3$ layer and said compound element active semiconductor layer.

9. A semiconductor device having a single crystal compound element active semiconductor layer on a ceramic substrate for integration of active components, and a passive layer on the same said substrate for integration of passive components, comprising:
    a ceramic substrate;
    semi-insulating buffer layers epitaxially grown on said ceramic substrate and having lattice constants substantially matching the respective lattice constants of said active and passive layers;
    active and passive layers epitaxially grown on respective said buffer layers, whereby to provide both active and passive layers monolithically integrated on said ceramic substrate.

10. The invention according to claim 9 wherein said passive layer is a high temperature superconducting, HTS, layer.

11. The invention according to claim 10 wherein said HTS layer is selected from the group consisting of YBaCuO and TlBaCaCuO.

* * * * *